(12) United States Patent
Rowell et al.

(10) Patent No.: US 10,935,583 B2
(45) Date of Patent: Mar. 2, 2021

(54) MEASUREMENT SYSTEM AND METHOD FOR PERFORMING TEST MEASUREMENTS

(71) Applicant: Rohde & Schwarz GmbH & Co. KG, Munich (DE)

(72) Inventors: Corbett Rowell, Munich (DE); Vincent Abadie, Hoehenschaeftlarn (DE); Benoit Derat, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 93 days.

(21) Appl. No.: 16/137,210

(22) Filed: Sep. 20, 2018

(65) Prior Publication Data

US 2019/0101579 A1 Apr. 4, 2019

(30) Foreign Application Priority Data

Sep. 29, 2017 (EP) .................................. 17194097

(51) Int. Cl.
| | |
|---|---|
| *G01R 29/08* | (2006.01) |
| *H04B 17/00* | (2015.01) |
| *H04B 7/0413* | (2017.01) |
| *H04B 17/10* | (2015.01) |

(52) U.S. Cl.
CPC ..... *G01R 29/0871* (2013.01); *G01R 29/0814* (2013.01); *G01R 29/0878* (2013.01); *H04B 7/0413* (2013.01); *H04B 17/0085* (2013.01); *H04B 17/103* (2015.01)

(58) Field of Classification Search
CPC ............ G01R 29/0871; G01R 29/0814; G01R 29/087; H04B 17/103; H04B 17/0085; H04B 17/0413
See application file for complete search history.

(56) References Cited

U.S. PATENT DOCUMENTS

| | | | |
|---|---|---|---|
| 10,033,473 B1 * | 7/2018 | Kyrolainen | .......... H04B 17/391 |
| 10,082,530 B1 * | 9/2018 | Wu | ........................ G01R 29/10 |
| 2010/0109932 A1 | 5/2010 | Liu | |
| 2011/0043418 A1 * | 2/2011 | Teshirogi | ........... G01R 29/0821 |
| | | | 343/703 |
| 2011/0200084 A1 * | 8/2011 | Griesing | ................ H01Q 3/267 |
| | | | 375/224 |
| 2013/0111995 A1 * | 5/2013 | Koehler | .............. G01N 29/221 |
| | | | 73/598 |
| 2015/0349859 A1 | 12/2015 | Emmanuel et al. | |

(Continued)

FOREIGN PATENT DOCUMENTS

KR 20100044644 A 4/2010

*Primary Examiner* — Dominic E Hawkins
(74) *Attorney, Agent, or Firm* — Christensen O'Connor Johnson Kindness PLLC

(57) ABSTRACT

A measurement system for testing a device under test is described that comprises at least one signal unit for processing a signal, at least two measurement antennas, at least two reflectors, a shielded space, and a testing position for the device under test. Each measurement antenna is orientated with respect to the testing position such that the testing position is located in at least one of a side lobe area and a back lobe area of the measurement antennas. The reflectors are located such that each reflector generates and/or collimates a planar wave at different angles with respect to the testing position. Further, a method for performing test measurements is described.

19 Claims, 1 Drawing Sheet

(56) References Cited

U.S. PATENT DOCUMENTS

2016/0359718 A1* 12/2016 Banerjee ................ H04L 43/50
2018/0006745 A1*  1/2018 Vanwiggeren ..... H04B 17/3912
2018/0062971 A1*  3/2018 Kyosti ................... H04L 43/50

* cited by examiner

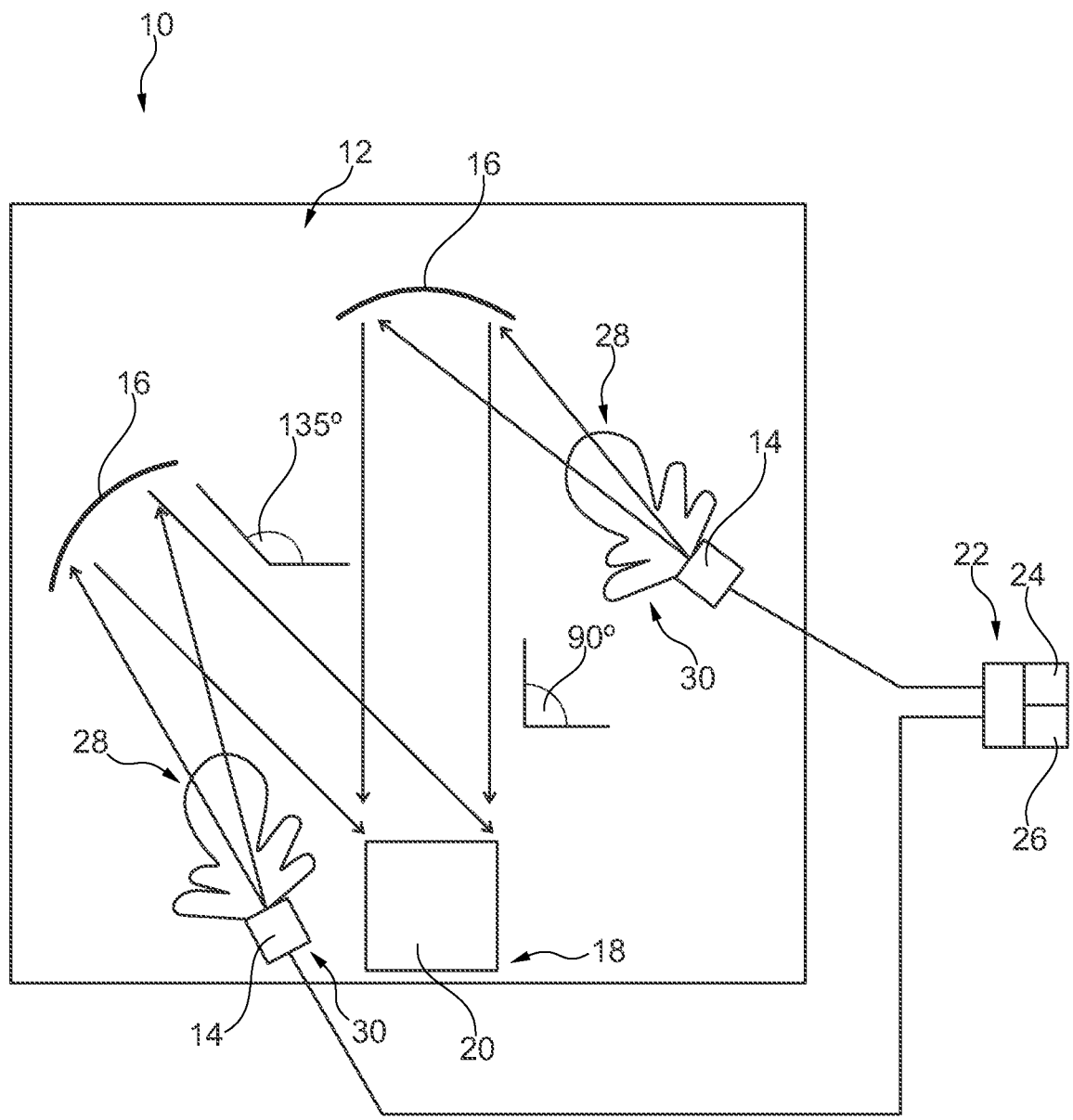

MEASUREMENT SYSTEM AND METHOD FOR PERFORMING TEST MEASUREMENTS

FIELD OF THE DISCLOSURE

Embodiment of the present disclosure generally relate to a measurement system for testing a device under test as well as a method for performing test measurements of a device under test.

BACKGROUND

In the state of the art, measurement systems are known for testing devices under test with regard to their over-the-air characteristics (OTA characteristics). The devices under test typically relates to communication devices using modern telecommunication standards. For the testing, at least one measurement antenna is assigned to a device under test to be tested by the measurement system wherein this measurement antenna is located in the far-field of the device under test. Thus, it is ensured that the far-field characteristics of the device under test can be tested in an appropriate manner.

Furthermore, it is known to use multiple measurement antennas that are located in the far-field in order to test the far-field characteristics of the device under test in a more accurate manner. Those setups of the measurement systems relate to the so-called Multi-probe anechoic chamber (MPAC) method as the multiple measurement antennas as well as the device under test are located in an anechoic chamber.

However, the known measurement systems and methods for performing test measurements are complicated and require a lot of efforts in order to obtain the intended measurement results. Further, some measurements intended cannot be performed by these measurement systems such that different measurement systems have to be used.

Therefore, there is a need for a measurement system being simple as well as a method for testing a device under test in a cost-efficient manner.

SUMMARY

Embodiments of the present disclosure provide a measurement system for testing a device under test comprising at least one signal unit for processing a signal, at least two measurement antennas, at least two reflectors, a shielded space, and a testing position for the device under test, wherein each measurement antenna is orientated with respect to the testing position such that the testing position is located in at least one of a side lobe area and a back lobe area of the measurement antennas, and wherein the reflectors are located such that each reflector generates and/or collimates a planar wave at different angles with respect to the testing position.

Accordingly, the measurement system is enabled to simulate different base stations or different multiple-in and multiple-out channels (MIMO channels) simultaneously, for example, different MIMO channels of a single base station, as at least two different planar waves can be processed for testing the device under test. Hence, the planar waves used for testing the characteristics of the device under test may impinge on the device under test under different angles wherein the device under test is placed at the testing position located in the side lobe area and/or the back lobe area of the radiation pattern of the device under test, for example its antenna unit. Accordingly, the beams of the measurement antennas, for example the beams of the radiation pattern, are not directly orientated towards the device under test. In a similar manner, the device under test may transmit signals at different angles which are collimated appropriately by the reflectors and forwarded to the measurement antennas for analyzing the transmission characteristics of the device under test even though the device under test placed on the testing position is located in the side lobe area and/or the back lobe area of the measurement antennas.

According to an aspect, the main lobe of the radiation pattern of each measurement antenna is not facing towards the testing location. Thus, the signals, namely the data streams, transmitted via the measurement antennas are not directly forwarded to the device under test, but reflected via the respective reflector such that the signals impinge on the device under test located at the testing position. In a similar manner, the signals generated by the device under test are not directly forwarded to the measurement antenna but reflected by the respective reflector prior to being received by the respective measurement antennas.

According to another aspect, the signal unit is at least one of a signal generation unit for generating a testing signal and a signal analyzing unit for analyzing a signal received. Depending on the test to be performed, a signal is generated by the device under test and received by the measurement antennas. In an alternative manner, test signals are generated by the signal unit and transmitted via the measurement antennas wherein these signals are received by the device under test. The signal unit may be configured to generate and receive a signal for analyzing purposes such that the signal unit can be operated in at least two different modes, namely a transmitting and a receiving/analyzing mode. Thus, the signal generation unit and the signal analyzing unit are commonly established by the single signal unit.

The signal unit may be configured to provide two different signals that are forwarded to the respective measurement antennas. Accordingly, two different base stations can be simulated by the measurement system wherein each of the simulated base stations provides a dedicated signal to the device under test, for example data stream. The different signals are transmitted via the measurement antennas and impinge on the respective reflector such that they are deflected towards the device under test.

An embodiment provides that the shielded space is established by at least one of a shielded room and a shielded chamber, for example an anechoic space. Thus, interfering signals can be avoided appropriately that may disturb the measurements. The shielded room has bigger dimensions compared to a shielded chamber such that larger devices under tests can be tested in the shielded room with regard to the shielded chamber. Both, the shielded room and the shielded chamber, encompass a space that is shielded from the outside, for example wherein it is ensured that no interfering signals enter the shielded space from the outside. In general, the measurement accuracy is increased due to the shielded space.

In some embodiments, the at least two reflectors and the respective measurement antennas are operated simultaneously in a first measurement mode. Hence, the device under test may be exposed to different signals simultaneously. Further, the signals emitted by the device under test are received under different angles in order to evaluate the MIMO characteristics of the device under test, for example its MIMO transmission characteristics.

According to an embodiment, the signal is a data stream. Thus, the device under test transmits a data stream that is forwarded to the signal unit for analyzing purposes. Alternatively or supplementarily, the data stream is generated by the signal unit wherein the data stream is forwarded to the device under test via the measurement antenna(s) and the respective reflector(s).

According to a certain embodiment, the data stream contains at least one higher level protocol in at least one of layer 2 and layer 3. The layer 2 and layer 3 relate to the so-called Open Systems Interconnection model (OSI model). These layers are also called data link layer (layer 2) and network layer (layer 3). Thus, certain protocol tests can be performed by the measurement system while using appropriate signals and/or data streams.

Furthermore, the measurement system may be configured to perform at least one of a multiple-in and multiple-out throughput measurement, a diversity gain measurement, and a multiple-in and multiple-out polarization measurement. Accordingly, the single measurement system can be used to perform different measurements being of interest for characterizing a device under test to be used in a multiple-in and multiple-out (MIMO) system, for instance for measuring the MIMO channel (matrix).

According to an aspect, the measurement antennas are at least one of a single-polarized antenna and a dual-polarized antenna, for example wherein the dual-polarized antenna is configured to process separate data streams. Therefore, different data streams that can inter alia be used for the diversity gain measurement and the multiple-in and multiple-out polarization measurements may be transmitted via a single measurement antenna being a dual-polarized one.

Another aspect provides that each of the reflectors transforms a near-field signal into a far-field signal. Thus, the far-field characteristics of the device under test can be tested easily even though a compact test range is provided as the signal used for the tests is transformed by the reflectors appropriately.

According to a certain embodiment, at least one of the reflectors, the measurement antennas and the testing position is assigned to the shielded space, for example wherein at least one of the reflectors, the measurement antennas and the testing position is located in the shielded space. In a certain embodiment, the reflectors, the measurement antennas and the testing position are all located within the shielded space such that disturbances during the tests and/or interfering signals can be avoided appropriately.

Further, the reflectors may be movable. Thus, the distance between the reflector and the measurement antenna or the distance between the reflector and the testing location can be varied. Moreover, the reflector can be moved such that the angle of the signal can be adjusted under which the signal impinges on the device under test.

Thus, the angle between different signals may be adjustable. As the reflectors can be moved, the angles of the signals processed by the reflectors can be varied. Accordingly, the angle between the different signals that are processed by the reflectors can be adjusted too. This angle may be called difference angle.

The measurement system may comprise a device under test that is located at the testing position. Thus, the device under test itself is part of the measurement system.

Furthermore, embodiments of the present disclosure provide a method for performing test measurements of a device under test by using a measurement system comprising at least two reflectors, two measurement antennas and a testing location for the device under test, with the following steps:

providing or receiving at least one data stream via the measurement antennas; and providing or collimating a planar wave at different angles with respect to the testing location via the reflectors.

Each reflector provides or collimates a planar wave so that two different planar waves at different angles are provided or collimated with respect to the testing location. Accordingly, at least two base stations can be simulated due to the different angles of the planar waves provided simultaneously. In a similar manner, the two different planar waves can be used for simulating at least two different MIMO channels. The planar waves may be received by the device under test in order to evaluate the OTA receiving characteristics of the device under test. Alternatively or supplementarily, the planar waves are provided by the reflectors wherein the respective signals are generated by the device under test itself such that the OTA transmission characteristics of the device under test can be evaluated appropriately.

In some embodiments, the measurement system used for performing the test measurements of the device under test is established by a measurement system as described above.

According to an aspect, the test measurement is at least one of:

a multiple-in and multiple-out throughput measurement by transmitting or receiving different data streams via the measurement antennas;

a diversity gain measurement by transmitting or receiving the same data stream via the measurement antennas; and a multiple-in and multiple-out polarization measurement by transmitting or receiving different data streams for each polarization by the measurement antennas.

Accordingly, different measurements of the device under test can be performed in order to obtain different information with regard to the OTA characteristics of the device under test, for example the OTA receiving and the OTA transmitting characteristics.

As different measurement antennas are provided, different data streams can be processed, transmitted and/or received appropriately.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying FIGURE that shows a schematic overview of a measurement system according to the present disclosure.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the FIGURE, a measurement system 10 is shown that is used for determining the over-the-air characteristics of a device under test. As shown in the FIGURE, the measurement system 10 comprises a shielded space 12 that is established by a shielded room. Alternatively, the shielded space 12 can be established by a shielded chamber being smaller than the shielded room. However, both, the shielded chamber and the shielded room, encompass a common space.

In the shown embodiment, two measurement antennas 14 are located within the shielded space 12 wherein both measurement antennas 14 are assigned to respective (sub-) reflectors 16. Accordingly, the first measurement antenna 14 is assigned to a first reflector 16 whereas the second measurement antenna 14 is assigned to a second reflector 16.

The measurement system 10 also comprises a testing position 18 for a device under test 20 that is located at the testing position 18. The device under test 20 may be a communication device, for example a user equipment such as a mobile phone. As the testing position 18 is located within the shielded space 12, the device under test 20 is also positioned within the shielded space 12 in order to communicate with the measurement antennas 14.

The measurement system 10 further comprises a signal unit 22 that is connected with both measurement antennas 14. In the shown embodiment, the signal unit 22 commonly encompasses a signal generation unit 24 and an analyzing unit 26 that is configured to generate a testing signal and to analyze a signal received via the measurement antennas 14 as will be described later. In some embodiments, the functions or partial functions of the measurement antennas 14 and/or the signal unit (e.g., signal generation unit 24 and/or the analyzing unit 26) can be implemented in software, in hardware (analog circuits, digital circuits, etc.), or combinations thereof.

In alternative embodiments, the signal unit 22 may be established by a single signal generation unit 24 that only generates signals to be forwarded to the measurement antennas 14. Alternatively, the signal unit 22 may be established by a single analyzing unit 26 that only analyses signals received by the measurement antennas 14.

In the shown embodiment, two measurement antennas 14 are provided such that two base stations or two channels of a multiple-in and multiple-out system (MIMO system) can be simulated simultaneously by using the measurement system 10. Thus, the measurement antennas 14 as well as the respective reflectors 16 are operated simultaneously in a first measurement mode that corresponds to a dedicated testing scenario.

Generally, more than two measurement antennas 14 may be provided in order to simulate more than two base stations or channels of a multiple-in and multiple-out system simultaneously.

In general, the measurement antennas 14 are also located within the shielded space 12 such that the radiation pattern of each measurement antenna 14 has a main lobe 28 that is directed towards the respective reflectors 16. Accordingly, the testing position 18 is located in a side lobe or a back lobe area 30 of each measurement antenna 14 as the respective main lobes 28 of each measurement antenna 14 are not facing towards the testing location 18, but towards the respective reflectors 16.

Accordingly, the reflectors 16 are located in the beam path between the testing location 18 and the respective measurement antennas 14 wherein the reflectors 16 deflect the signals appropriately as shown in the FIGURE.

Further, the reflectors 16 are located within the shielded space 12 with respect to the testing position 18 such that each reflector 16 generates and/or collimates a planar wave at different angles with respect to the testing position 18. Hence, the reflectors 16 are configured to transform a near-field signal into a far-field signal in order to ensure that the measurement system 10 is enabled to evaluate the far-field characteristics of the device under test 20, for example the far-field over-the-air characteristics with regard to the transmission and receiving characteristics of the device under test 20.

In the shown embodiment, the first reflector 16 provides a planar wave that has an angle of 90° with respect to the device under test 20 whereas the second reflector 16 provides a planar wave that has an angle of 135° with regard to the device under test 20 being located at the testing position 18.

Generally, both reflectors 16 are movable such that the distance between each reflector 16 and the respective measurement antenna 14 as well as the distance between each reflector 16 and the testing position 18 can be varied if desired. Moreover, the reflectors 16 can be moved such that the angle of the planar wave with respect to the device under test 20 or rather the testing position 18 can be adjusted appropriately. Hence, the impinging direction may be varied, for example the impinging angle. As both reflectors 16 are movable, the angle between the different signals is also adjustable which means that the angle difference of the planar waves impinging on the device under test 20 can be varied appropriately for different tests. Therefore, different test scenarios and different MIMO characteristics may be tested by using the compact measurement system 10.

In some embodiments, at least one of the measurement antennas 14 is established by a dual-polarized antenna such that the single dual-polarized measurement antenna can process separate data streams simultaneously. Alternatively or supplementary, at least one of the measurement antennas 14 is a single polarized antenna.

The measurement system 10 can be used to perform at least one of a multiple-in and multiple-out throughput measurement, a diversity gain measurement, and a multiple-in and multiple-out polarization measurement.

As already mentioned, the device under test 20 may generate signals that are directed towards the reflectors 16 wherein the appropriate signals are reflected by the reflectors 16 and forwarded to the measurement antennas 14 such that these signals are fed to the signal unit 22 for analyzing purposes. Accordingly, the OTA transmission characteristics of the device under test 20 can be investigated appropriately.

Further, the signal unit 22 may generate testing signals, for example via a signal generator, that are fed to the measurement antennas 14 for being transmitted and reflected by the respective reflectors 16 towards the device under test 20 in order to test the over-the-air receiving characteristics of the device under test 20, for example its far-field receiving characteristics.

The device under test 20 may be connected to an analyzing unit for evaluating purposes, for example the analyzing unit 26 of the signal unit 22. Alternatively, a separately formed analyzing unit may be used.

The test measurements performed may be a multiple-in and multiple-out throughput measurement wherein different data streams are transmitted or received via the measurement antennas 14. The device under test 20 and the signal unit 22 are operated in an appropriate manner.

For instance, the signal unit 22 generates two different signals that are forwarded to the measurement antennas 14 which emit the different signals into the shielded space 12. These signals are deflected by the reflectors 16 towards the device under test 20.

Accordingly, the signal (data stream) itself, namely its characteristics and/or its content, as well as the impinging angle of the signal may be varied by the signal unit 20 and the reflectors 16, respectively. This ensures that two different base stations can be simulated appropriately since the impinging direction as well as the signal are altered in a desired manner.

Further, a diversity gain measurement may be performed by transmitting or receiving the same data stream via the measurement antennas 14. For this test, the device under test 20 and the signal unit 22 are also operated in an appropriate manner.

Another test measurement may be established by a multiple-in and multiple-out polarization measurement wherein different data streams for each polarization are transmitted or received via the measurement antennas 14. As already mentioned, at least one of the measurement antennas 14 may be provided by a dual-polarized antenna which simplifies the multiple-in and multiple-out polarization measurement appropriately. Alternatively, both measurement antennas 14 are operated differently.

The signals transmitted, namely the appropriate data streams, correspond to the transmission technologies to be tested. For instance, these data streams comprise higher level protocol(s) in at least one of layer 2 or 3. Accordingly, protocol tests can be performed by the measurement system 10.

Accordingly, the measurement system 10 as well as the method for performing test measurements ensures that wideband millimeter-wave multiple-in and multiple-out (MIMO) and/or radio resource management (RRM) measurements can be performed in an easy and cost-efficient manner by using the compact measurement system 10.

In general, the compact measurement system 10, also called test range, with multiple simultaneous data streams is provided. Such a measurement system 10 may be used by user equipment manufacturers, test houses, research and development departments, and chipset manufacturers in an appropriate manner for testing the respective devices under test.

In some embodiments, 3GPP conformance testing may be performed in a less complex manner while using the measurement system 10 described above since the whole setup of the measurement system 10 is small.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system for testing a device under test comprising:
at least one signal unit configured to process a signal, at least two measurement antennas, at least two reflectors, a shielded space, and a testing position for said device under test, each measurement antenna being orientated with respect to said testing position such that said testing position is located in at least one of a side lobe area or a back lobe area of said measurement antennas, and said reflectors being located such that each reflector at least one of generates or collimates a planar wave at different angles with respect to said testing position.

2. The measurement system according to claim 1, wherein a main lobe of the radiation pattern of each measurement antenna is not facing towards said testing location.

3. The measurement system according to claim 1, wherein said signal unit is at least one of a signal generation unit configured for generating a testing signal or a signal analyzing unit for analyzing a signal received.

4. The measurement system according to claim 1, wherein said signal unit is configured to provide two different signals that are forwarded to the respective measurement antennas.

5. The measurement system according to claim 1, wherein said at least two reflectors and said respective measurement antennas are operated simultaneously in a first measurement mode.

6. The measurement system according to claim 1, wherein said signal is a data stream.

7. The measurement system according to claim 6, wherein said data stream contains at least one higher level protocol in at least one of layer 2 or layer 3.

8. The measurement system according to claim 1, wherein said measurement system is configured to perform at least one of a multiple-in and multiple-out throughput measurement, a diversity gain measurement, or a multiple-in and multiple-out polarization measurement.

9. The measurement system according to claim 1, wherein said measurement antennas are at least one of single-polarized antenna or a dual-polarized antenna.

10. The measurement system according to claim 9, wherein said dual-polarized antenna is configured to process separate data streams.

11. The measurement system according to claim 1, wherein each of said reflectors transforms a near-field signal into a far-field signal.

12. The measurement system according to claim 1, wherein at least one of said reflectors, said measurement antennas or said testing position is assigned to said shielded space.

13. The measurement system according to claim 1, wherein at least one of said reflectors, said measurement antennas or said testing position is located in said shielded space.

14. The measurement system according to claim 1, wherein said reflectors are movable.

15. The measurement system according to claim 1, wherein the angle between different signals is adjustable.

16. The measurement system according to claim 1, wherein said measurement system comprises a device under test located at said testing position.

17. A method for performing test measurements of a device under test by using a measurement system comprising at least two reflectors, two measurement antennas and a testing location for said device under test, each measurement antenna being orientated with respect to said testing position such that said testing position is located in at least one of a side lobe area or a back lobe area of said measurement antennas, with the following steps:
providing or receiving at least one data stream via said measurement antennas; and
providing or collimating a planar wave at different angles with respect to said testing location via said reflectors.

18. The method according to claim 17, wherein said test measurement is at least one of:
a multiple-in and multiple-out throughput measurement by transmitting or receiving different data streams via said measurement antennas;
a diversity gain measurement by transmitting or receiving the same data stream via said measurement antennas; or a multiple-in and multiple-out polarization measurement by transmitting or receiving different data streams for each polarization via said measurement antennas.

19. A measurement system for testing a device under test comprising at least one signal unit for processing a signal, at least two measurement antennas, at least two reflectors, a shielded space, and a testing position for said device under test, each measurement antenna being orientated with respect to said testing position such that said testing position is located in at least one of a side lobe area or a back lobe area of said measurement antennas such that the beams of the measurement antennas are not directly orientated towards the device under test, and said reflectors being located such that each reflector at least one of generates or collimates a planar wave at different angles with respect to said testing position.

\* \* \* \* \*